US011164697B2

(12) United States Patent
Matsushima et al.

(10) Patent No.: US 11,164,697 B2
(45) Date of Patent: Nov. 2, 2021

(54) COIL-INTEGRATED-TYPE YOKE AND MANUFACTURING METHOD OF THE SAME

(71) Applicant: EBARA CORPORATION, Tokyo (JP)

(72) Inventors: Keisuke Matsushima, Tokyo (JP);
Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 262 days.

(21) Appl. No.: 16/461,109

(22) PCT Filed: Apr. 4, 2018

(86) PCT No.: PCT/JP2018/014354
§ 371 (c)(1),
(2) Date: May 15, 2019

(87) PCT Pub. No.: WO2018/186427
PCT Pub. Date: Oct. 11, 2018

(65) Prior Publication Data
US 2020/0066477 A1 Feb. 27, 2020

(30) Foreign Application Priority Data
Apr. 7, 2017 (JP) .............................. JP2017-076547

(51) Int. Cl.
*H01F 7/06* (2006.01)
*H01F 41/04* (2006.01)
(Continued)

(52) U.S. Cl.
CPC ............... *H01F 41/04* (2013.01); *H01F 7/20* (2013.01); *H01F 27/28* (2013.01); *H01F 41/06* (2013.01);
(Continued)

(58) Field of Classification Search
CPC ........ H01F 41/04; H01F 41/06; H01F 41/127; H01F 7/20; H01F 7/202; H01F 27/28; H01J 37/1472; H01J 37/28; H01J 2237/152
See application file for complete search history.

(56) References Cited

U.S. PATENT DOCUMENTS 4,856,333 A * 8/1989 Ito .......................... G01P 15/132
73/514.19
6,075,430 A * 6/2000 Lindqvist ................ H01F 17/04
29/605

(Continued)

FOREIGN PATENT DOCUMENTS

JP    S52-34942 U    3/1977
JP    S58-161312 A   9/1983
(Continued)

OTHER PUBLICATIONS

International Search Report Issued in Patent Application No. PCT/JP2018/014354 dated Jul. 10, 2018.
(Continued)

*Primary Examiner* — Paul D Kim
(74) *Attorney, Agent, or Firm* — Pearne & Gordon LLP

(57) ABSTRACT

A coil-integrated-type yoke for realizing a deflector that can accurately deflect an orbit of an electron beam and a manufacturing method thereof are provided. There is provided a manufacturing method of a coil-integrated-type yoke, the manufacturing method including: a step of sequentially inserting a molding agent, a coil, and a spacer into a groove heading from a first surface toward a second surface of the yoke; and a step of polishing the first surface of the yoke and the spacer together.

6 Claims, 7 Drawing Sheets

(51) Int. Cl.
  *H01F 7/20*    (2006.01)
  *H01F 27/28*   (2006.01)
  *H01J 37/147*  (2006.01)
  *H01F 41/06*   (2016.01)
  *H01J 37/28*   (2006.01)

(52) U.S. Cl.
  CPC ........... *H01J 37/1472* (2013.01); *H01J 37/28* (2013.01); *H01J 2237/152* (2013.01)

(56) References Cited

U.S. PATENT DOCUMENTS

| | | | |
|---|---|---|---|
| 6,747,382 B2* | 6/2004 | Yajima | H02K 7/081 |
| | | | 310/90 |
| 2016/0118182 A1 | 4/2016 | Yukawa et al. | |

FOREIGN PATENT DOCUMENTS

| | | | |
|---|---|---|---|
| JP | H02-246302 A | 10/1990 | |
| JP | H04-284608 A | 10/1992 | |
| JP | H05-275225 A | 10/1993 | |
| JP | H06-124654 A | 5/1994 | |
| JP | H11-307383 A | 11/1999 | |
| JP | 2015-220234 A | 12/2015 | |
| JP | 2016-082187 A | 5/2016 | |

OTHER PUBLICATIONS

Written Opinion Issued in Patent Application No. PCT/JP2018/014354 dated Jul. 10, 2018.
Japanese Office Action issued in Japanese Patent Application No. 2017-076547 dated Oct. 20, 2020.

* cited by examiner

US 11,164,697 B2

COIL-INTEGRATED-TYPE YOKE AND MANUFACTURING METHOD OF THE SAME

TECHNICAL FIELD

The present invention relates to a coil-integrated-type yoke and a manufacturing method thereof.

BACKGROUND ART

In an apparatus that irradiates an electron beam, such as scanning electron microscope (SEM), a deflector is installed on an orbit of the electron beam and the orbit of the electron beam is deflected. As the deflector, a magnetic field deflector that deflects an electron beam by means of a magnetic field generated by supplying electricity to a coil embedded in a yoke is known.

CITATION LIST

Patent Literature

Patent Literature 1: JP 2015-220234 A
Patent Literature 2: JP 58-161312 A

SUMMARY OF INVENTION

Technical Problem

An object of the present invention is to provide a coil-integrated-type yoke for realizing a deflector that can accurately deflect an orbit of an electron beam and a manufacturing method thereof.

Solution to Problem

According to an aspect of the present invention, there is provided a method for manufacturing a coil-integrated-type yoke, the method including: a step of sequentially inserting a molding agent, a coil, and a spacer into a groove heading from a first surface toward a second surface of a yoke; and a step of polishing the first surface of the yoke and the spacer together.

It is desirable that the first surface of the yoke and the spacer are polished together so that an angle between the first surface of the yoke and a side surface of the groove is 90 degrees.

It is desirable that a rigidity of the spacer is comparable with a rigidity comparable with that of the yoke.

It is desirable that in a bottom portion of the groove, a hole reaching the second surface is provided in a bottom portion of the groove, and the method further includes curing the molding under a state where the molding agent is pressed by using the hole after the step of inserting the molding agent, the coil, and the spacer into the groove.

It is desirable that upon inserting the spacer into the groove, only a part of the spacer is inserted into the groove, and thereafter, the first surface of the yoke and the spacer are polished together in a state where the first surface of the yoke and the spacer are flush with each other.

According to another aspect of the present invention, there is provided a coil-integrated-type yoke including: a yoke which has a first surface and a second surface, wherein a groove heading from the first surface toward the second surface is provided on the yoke; and a molding agent, a coil, and a spacer arranged in the groove in order from the second surface, wherein the first surface of the yoke and the spacer are flush with each other, and an angle between the first surface of the yoke and a side surface of the groove is 90 degrees.

Advantageous Effects of Invention

It is possible to realize a deflector that can accurately deflect an orbit of an electron beam.

DESCRIPTION OF EMBODIMENTS

Hereinafter, an embodiment according to the present invention will be described in detail with reference to the drawings.

Figure 1:
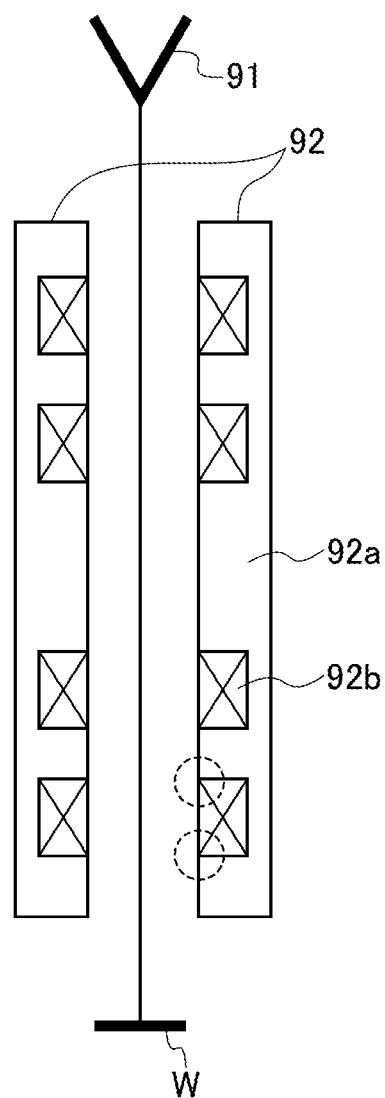
FIG. 1 is a schematic configuration diagram of SEM.

FIG. 1 is a schematic configuration diagram of SEM. The SEM includes an electron gun 91, a deflector 92, and the like arranged in a vacuum tube (not shown in FIG. 1). An electron beam from the electron gun 91 is deflected by the deflector 92 and reaches a specimen W. It is possible to observe a surface of the specimen W by capturing mirror electrons reflected from the specimen W.

The deflector 92 is formed by embedding a coil 92b into a groove (a recessed portion) of a flat yoke 92a. A magnetic field is generated by supplying electricity to the coil 92b, so that the electron beam is deflected. Here, when the coil 92b is embedded into the groove of the yoke 92a, corners (portions surrounded by dashed lines in FIG. 1) may be broken off. When the corners are not right-angled, magnetic field lines from the coil 92b may be disturbed, so that it may not be possible to theoretically deflect the electron beam. Therefore, in the present embodiment, the yoke 92a (coil-integrated-type yoke) embedded with the coil 92b is manufactured in a manner as described below.

Figure 2A:
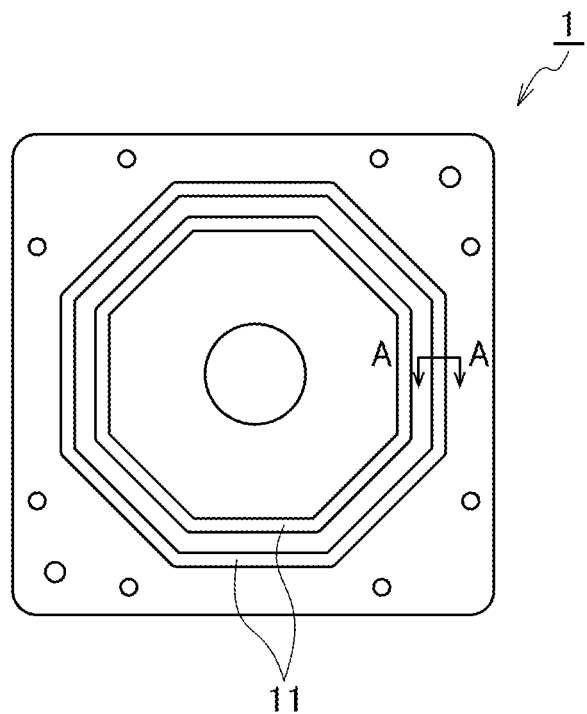
FIG. 2A is a top view of a yoke 1 before being embedded with a coil.

FIG. 2A is a top view of a yoke 1 before being embedded with a coil. The yoke 1 is formed of a magnetic material such as ferrite. The contour of the yoke 1 has an approximately square shape having sides of approximately 150 mm. The yoke 1 is provided with two grooves 11 of an approximately regular octagonal shape having a width of about 5 mm and a depth of about 10 mm. The yoke 1 may be formed with the grooves 11 for embedding coils, and the size and shape of the yoke 1 are not particularly limited.

Figure 2B:
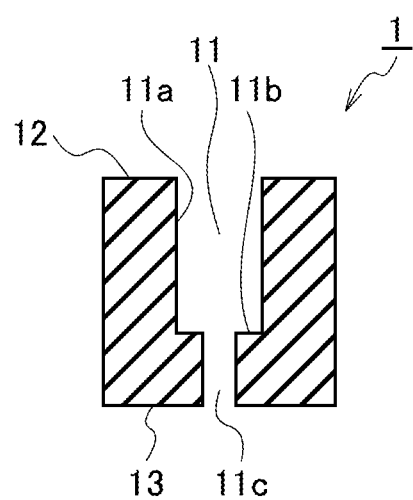
FIG. 2B is a cross-sectional view taken along line A-A in FIG. 2A.

FIG. 2B is a cross-sectional view taken along line A-A in FIG. 2A. The yoke 1 has an upper surface 12 and a lower surface 13 parallel to each other. The groove 11 is formed from the upper surface 12 to the lower surface 13. An angle between the upper surface 12 and a side surface 11a of the groove 11 is about 90 degrees. At this time point, the angle need not be exactly 90 degrees. There is a hole 11c in a bottom surface 11b of the groove 11, and the hole 11b reaches the lower surface 13.

Figure 3:
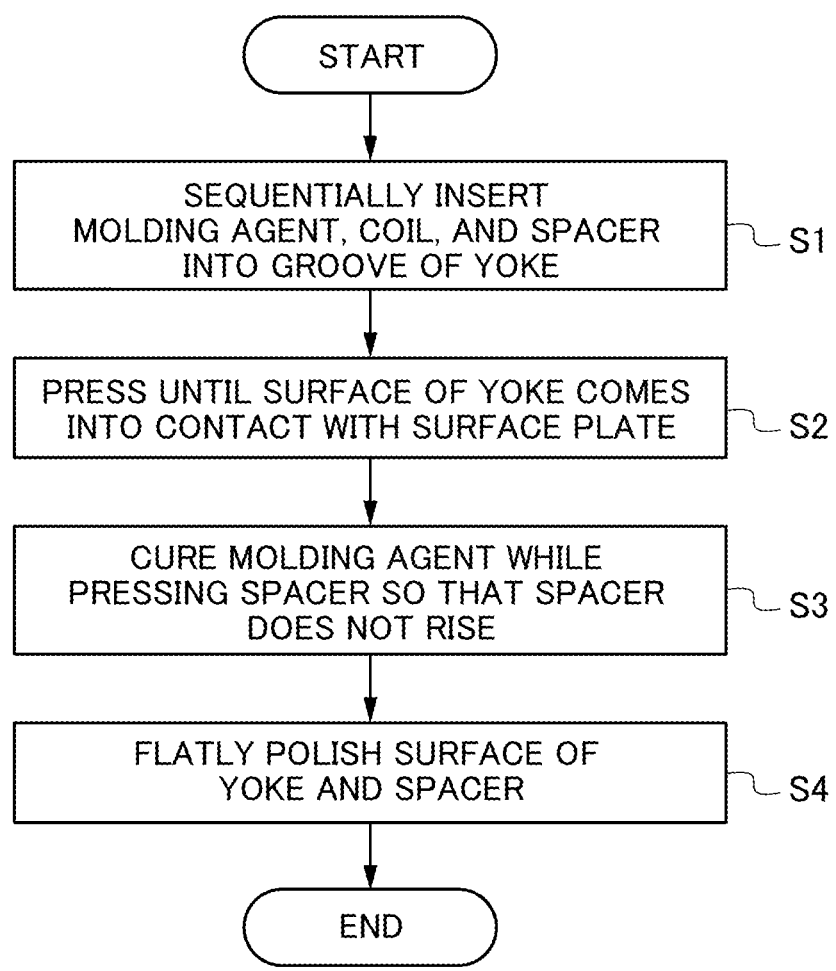
FIG. 3 is a manufacturing process chart of a coil-integrated-type yoke.
Figure 4:
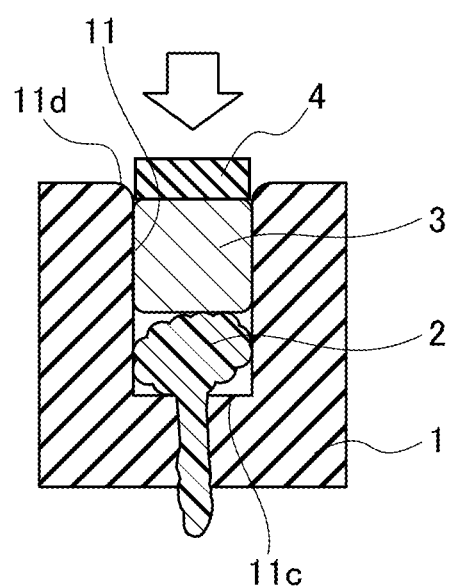
FIG. 4 is a cross-sectional view for explaining a manufacturing process of the coil-integrated-type yoke.

FIG. 3 is a manufacturing process chart of the coil-integrated-type yoke. First, a molding agent 2, a coil 3, and a spacer 4 are sequentially inserted into the groove 11 (step S1). Thereby, a state shown in FIG. 4 appears.

The molding agent 2 is formed of, for example, a silicon-based material. The molding agent 2 has flexibility at normal temperature, but is cured by heating. A part of the molding agent 2 may be pushed into the hole 11c.

The coil 3 is molded in advance so as to be fitted into the groove 11. When the coil 3 is inserted into the groove 11, the coil 3 may hit the yoke 1 and a corner 11d of the groove 11 may be broken off. However, this causes no problem in the present embodiment.

The spacer 4 is a plate member which has a rectangular cross section and is formed of, for example, aluminum, copper, titanium, or plastic. The width of the spacer 4 is slightly smaller than the width of the groove 11. Both side surfaces of the spacer 4 respectively come into contact with both side surfaces 11a of the groove 11. It is preferable that the rigidity of the spacer is similar to that of the coil 3, for example, a difference or ratio between the rigidities is smaller than a predetermined value for convenience of polishing the spacer 4 along with the coil 3 later. Further, it is preferable that not whole but part (about a half) of the spacer 4 is inserted into the groove 11 and the remaining part protrudes from the upper surface.

Figure 5:
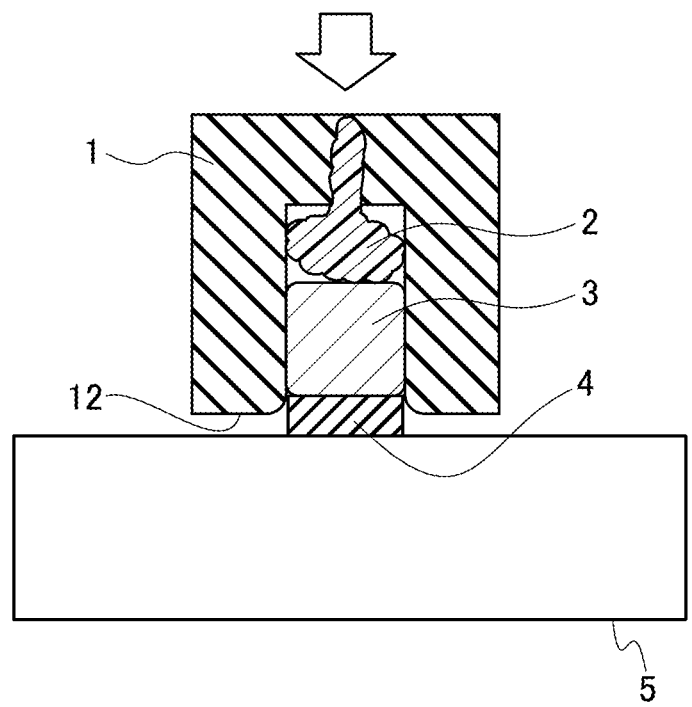
FIG. 5 is a cross-sectional view for explaining the manufacturing process of the coil-integrated-type yoke subsequent to FIG. 4.
Figure 6:
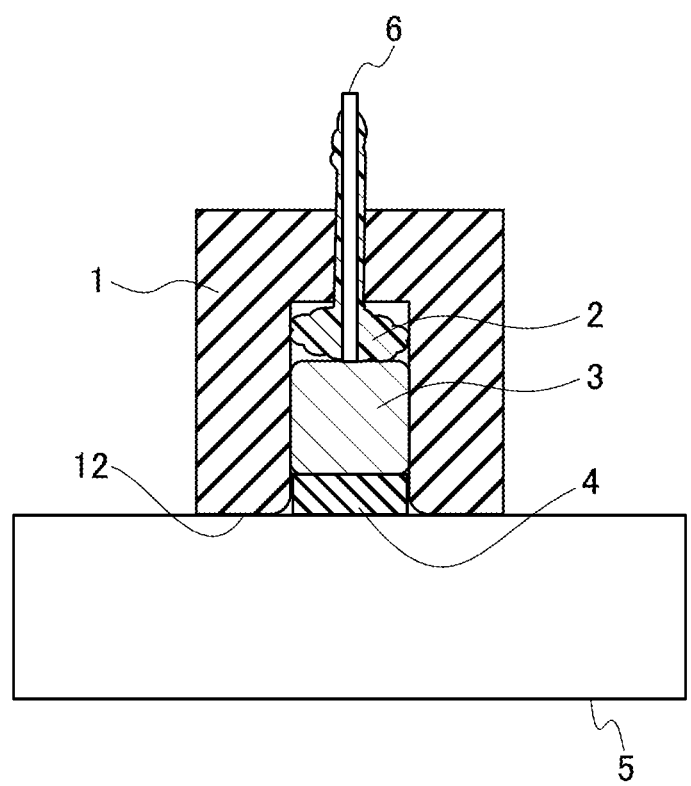
FIG. 6 is a cross-sectional view for explaining the manufacturing process of the coil-integrated-type yoke subsequent to FIG. 5.

Subsequently, the yoke 1 is turned upside down as needed, a flat surface plate 5 and the upper surface 12 of the yoke 1 are pressed against each other (FIG. 5), and the spacer 4 is pressed until the upper surface 12 of the yoke 1 comes into contact with the surface plate 5 (step S2 in FIG. 3). Thereby, the molding agent 2 is deformed and pushed out to the hole 11c or inserted inside the coil 3, so that the entire spacer 4 is stored inside the groove 11 and a state shown in FIG. 6 appears. In other words, the upper surface 12 of the yoke 1 and an upper surface 41 of the spacer 4 are flush with each other.

Thereafter, the molding agent 2 is cured by heating while the molding agent 2 and the coil 3 are pressed by a pressing member such as a rod 6 through the hole 11c so that the spacer 4 does not rise (step S3 in FIG. 3).

Figure 7:
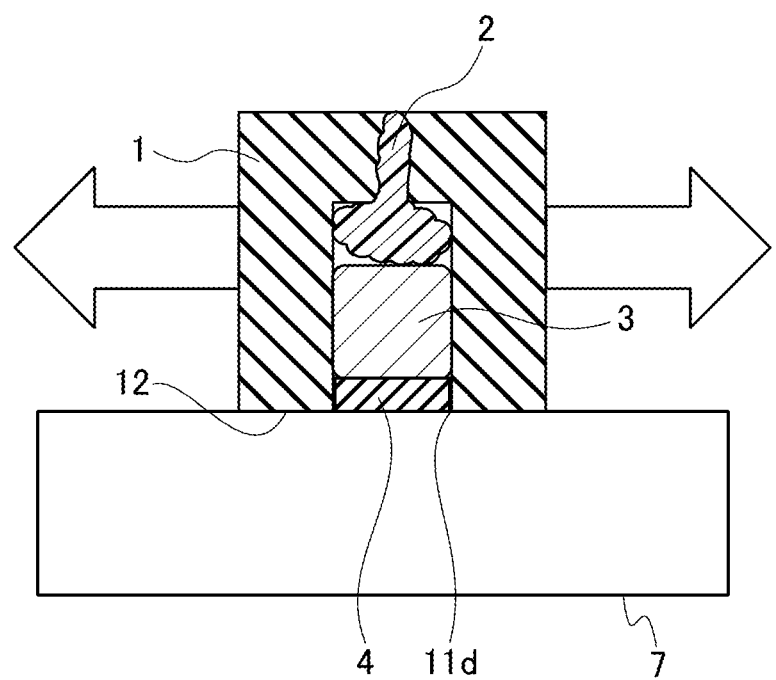
FIG. 7 is a cross-sectional view for explaining the manufacturing process of the coil-integrated-type yoke subsequent to FIG. 6.

Then, the upper surface 12 of the yoke 1 and the spacer 4 are polished together to be flat by using a polishing plate 7 so that the corner 11d has a right angle (step S4, FIG. 7). The upper surface 12 of the yoke 1 can be made flat by the polishing and the spacer 4 is located inside the groove 11, so that the corner 11d of the groove 11 is not broken off when the polishing is performed. An angle between the upper surface 12 of the yoke 1 and the side surface 11a of the groove 11 is formed into a right angle without a crack of 5 μm or less, so that it is possible to sufficiently prevent magnetic field lines from being disturbed. A distance between the upper surface of the yoke 1 and the coil 3 can be a desired constant value by providing the spacer 4.

The coil-integrated-type yoke manufactured as described above includes a yoke 1 provided with the grooves 11, and the (cured) molding agent 2, the coil 3, and the spacer 4 that are arranged in order from the bottom surface 11b of the groove 11 (the lower surface 13). The upper surface 12 of the yoke 1 and the upper surface of the spacer 4 are flush with each other, and the angle between the upper surface 12 of the yoke 1 and the side surface 11a of the groove 11 is about 90 degrees.

As described above, in the present embodiment, the molding agent 2, the coil 3, and the spacer 4 are inserted into the groove 11 of the yoke 1, and the spacer 4 and the upper surface 12 of the yoke 1 are polished together to be flat. Thereby, the upper surface 12 of the yoke 1 and the side surface 11a of the groove 11 form a right angle. It is possible to accurately deflect an orbit of an electron beam by applying such a coil-integrated-type yoke to the deflector 92.

The above embodiment is described so that a person with an ordinary skill in the technical field to which the invention pertains can implement the invention. Various modified examples of the above embodiment can be naturally made by those skilled in the art, and the technical idea of the invention can be applied to other embodiments. Therefore, the invention is not limited to the described embodiment and should encompass the widest range in accordance with the technical ideas defined by the claims.

REFERENCE SIGNS LIST 1 yoke
11 groove
11a side surface
11b bottom surface
11c hole
12 upper surface
13 lower surface
2 molding agent
3 coil
4 spacer
5 surface plate
6 rod
7 polishing plate

What is claimed is:

1. A method for manufacturing a coil-integrated-type yoke, the method comprising:
   sequentially inserting a molding agent, a coil, and a spacer into a groove heading from a first surface toward a second surface of a yoke; and
   polishing the first surface of the yoke and the spacer together.

2. The method for manufacturing the coil-integrated-type yoke according to claim 1, wherein the first surface of the yoke and the spacer are polished together so that an angle between the first surface of the yoke and a side surface of the groove is 90 degrees.

3. The method for manufacturing the coil-integrated-type yoke according to claim 1, wherein a rigidity of the spacer is comparable with a rigidity of the yoke.

4. The method for manufacturing the coil-integrated-type yoke according to claim 1, wherein
   a hole reaching the second surface is provided in a bottom portion of the groove, and
   the method further comprising curing the molding agent under a state where the molding agent is pressed by using the hole after inserting the molding agent, the coil, and the spacer into the groove.

5. The method for manufacturing the coil-integrated-type yoke according to claim 1, wherein
   upon inserting the spacer into the groove, only a part of the spacer is inserted into the groove, and
   thereafter, the first surface of the yoke and the spacer are polished together in a state where the first surface of the yoke and the spacer are flush with each other.

6. A coil-integrated-type yoke comprising:
a yoke comprising a first surface and a second surface, wherein a groove heading from the first surface toward the second surface is provided on the yoke; and
a molding agent, a coil, and a spacer arranged in the groove in order from the second surface,
wherein the first surface of the yoke and the spacer are flush with each other, and
an angle between the first surface of the yoke and a side surface of the groove is 90 degrees.

* * * * *